(12) United States Patent
Lanzillo et al.

(10) Patent No.: US 10,796,833 B2
(45) Date of Patent: Oct. 6, 2020

(54) MAGNETIC TUNNEL JUNCTION WITH LOW SERIES RESISTANCE

(71) Applicant: INTERNATIONAL BUSINESS MACHINES CORPORATION, Armonk, NY (US)

(72) Inventors: Nicholas A. Lanzillo, Troy, NY (US); Benjamin D. Briggs, Waterford, NY (US); Michael Rizzolo, Albany, NY (US); Theodorus E. Standaert, Clifton Park, NY (US); Lawrence A. Clevenger, Saratoga Springs, NY (US); James Stathis, Poughquag, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 16/141,195

(22) Filed: Sep. 25, 2018

(65) Prior Publication Data
US 2020/0098499 A1    Mar. 26, 2020

(51) Int. Cl.
| | |
|---|---|
| H01F 10/32 | (2006.01) |
| H01L 43/02 | (2006.01) |
| H01L 43/12 | (2006.01) |
| H01F 41/34 | (2006.01) |
| H01L 43/10 | (2006.01) |

(52) U.S. Cl.
CPC ......... *H01F 10/3259* (2013.01); *H01F 41/34* (2013.01); *H01L 43/02* (2013.01); *H01L 43/10* (2013.01); *H01L 43/12* (2013.01); *H01F 10/329* (2013.01); *H01F 10/3286* (2013.01)

(58) Field of Classification Search
CPC .............................. H01F 10/3259; H01L 43/02
See application file for complete search history.

(56) References Cited

U.S. PATENT DOCUMENTS

| | | |
|---|---|---|
| 6,507,466 B1 | 1/2003 | Hayashi et al. |
| 7,023,009 B2 | 4/2006 | Kostylev et al. |
| 7,151,654 B1 | 12/2006 | Mao et al. |
| 7,894,168 B2 | 2/2011 | Kiyono et al. |
| 8,058,871 B2 | 11/2011 | Guo et al. |
| 8,270,208 B2 | 9/2012 | Gaidis et al. |
| 8,835,889 B1 | 9/2014 | Abraham et al. |
| 8,981,505 B2 | 3/2015 | Moriyama et al. |
| 9,543,509 B2 | 1/2017 | Liou et al. |
| 9,620,566 B2 | 4/2017 | Park |

(Continued)

*Primary Examiner* — Quoc D Hoang
(74) *Attorney, Agent, or Firm* — Tutunjian & Bitetto, P.C.; Vazken Alexanian

(57) ABSTRACT

An electrical device structure including a magnetic tunnel junction structure having a first tunnel junction dielectric layer positioned between a free magnetization layer and a fixed magnetization layer. A magnetization enhancement stack present on the magnetic tunnel junction structure. The magnetization enhancement stack includes a second tunnel junction layer that is in contact with the free magnetization layer of the magnetic tunnel junction structure, a metal contact layer present on the second tunnel junction layer, and a metal electrode layer present on the metal contact layer. A metallic ring on a sidewall of the magnetic enhancement stack, wherein a base of the metallic ring may be in contact with the free magnetization layer of the magnetic tunnel junction structure.

18 Claims, 7 Drawing Sheets

(56) References Cited

U.S. PATENT DOCUMENTS

2013/0082339 A1* 4/2013 Aggarwal ............... H01L 43/12
                                                          257/421
2019/0088864 A1* 3/2019 Cho ........................ H01L 43/08

* cited by examiner

MAGNETIC TUNNEL JUNCTION WITH LOW SERIES RESISTANCE

BACKGROUND

Technical Field

The present invention generally relates to microelectronics, and more particularly to devices including magnetic tunnel junctions (MJT).

Description of the Related Art

A basic structure of a magnetic tunnel junction (MJT) includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. An MTJ stores information by switching the magnetization state of the magnetic free layer.

SUMMARY

In accordance with one embodiment, a method and structure are described for providing a magnetic tunnel junction (MTJ) with a metallic ring, in which the metallic ring acts as a shunt resistor surrounding a top tunnel barrier of the magnetic tunnel junction (MTJ) structure. The metallic ring that functions as a shunt resistor provides a low resistance channel for electrons to travel from the top free layer of the magnetic tunnel junction (MTJ) to the top electrode without disturbing the perpendicular magnetic anisotropy characteristics of the magnetic tunnel junction (MTJ) structure.

In one embodiment, an electrical device structure is provided that includes a magnetic tunnel junction structure including a first tunnel junction dielectric layer positioned between a free magnetization layer and a fixed magnetization layer. A magnetization enhancement stack is present on the magnetic tunnel junction structure. In one embodiment, the magnetization enhancement stack includes a second tunnel junction layer that is in contact with the free magnetization layer of the magnetic tunnel junction structure, a metal contact layer present on the second tunnel junction layer, and a metal electrode layer present on the metal contact layer. A metallic ring may be present around the magnetic enhancement stack, wherein a base of the metallic ring may be in contact with the free magnetization layer of the magnetic tunnel junction structure.

In another embodiment, an electrical device structure is provided that includes a magnetic tunnel junction structure including a first tunnel junction dielectric layer positioned between a free magnetization layer and a fixed magnetization layer. A magnetization enhancement stack is present on the magnetic tunnel junction structure. The magnetization enhancement stack has a width less than a width of the magnetic tunnel junction structure. In one embodiment, the magnetization enhancement stack includes a second tunnel junction layer that is in contact with the free magnetization layer of the magnetic tunnel junction structure, a metal contact layer present on the second tunnel junction layer, and a metal electrode layer present on the metal contact layer. A metallic ring may be present around the magnetic enhancement stack, wherein a base of the metallic ring may be in contact with the free magnetization layer of the magnetic tunnel junction structure. A dielectric spacer may be present on an outer sidewall of the metallic ring, the outside sidewall of the dielectric spacer aligned with an outside sidewall of the magnetic tunnel junction structure.

In another aspect, a method is provided for forming a magnetic tunnel junction (MTJ) with a metallic ring, in which the metallic ring acts as a shunt resistor surrounding a top tunnel barrier of the magnetic tunnel junction (MTJ) structure. In one embodiment, the method may include forming a top electrode hardmask atop a layered stack including a magnetization enhancement stack that is present on a magnetic tunnel junction (MJT) structure. The top electrode hardmask is employed as an etch mask for etching at least a tunnel junction dielectric layer of the magnetization enhancement stack to provide a pedestal of the magnetization enhancement stack having a width less than the magnetic tunnel junction (MTJ) structure. A metallic ring may be formed on the side all of the pedestal of the magnetization enhancement stack, wherein a base of the metallic ring may be in contact with a free magnetization layer of the magnetic tunnel junction structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
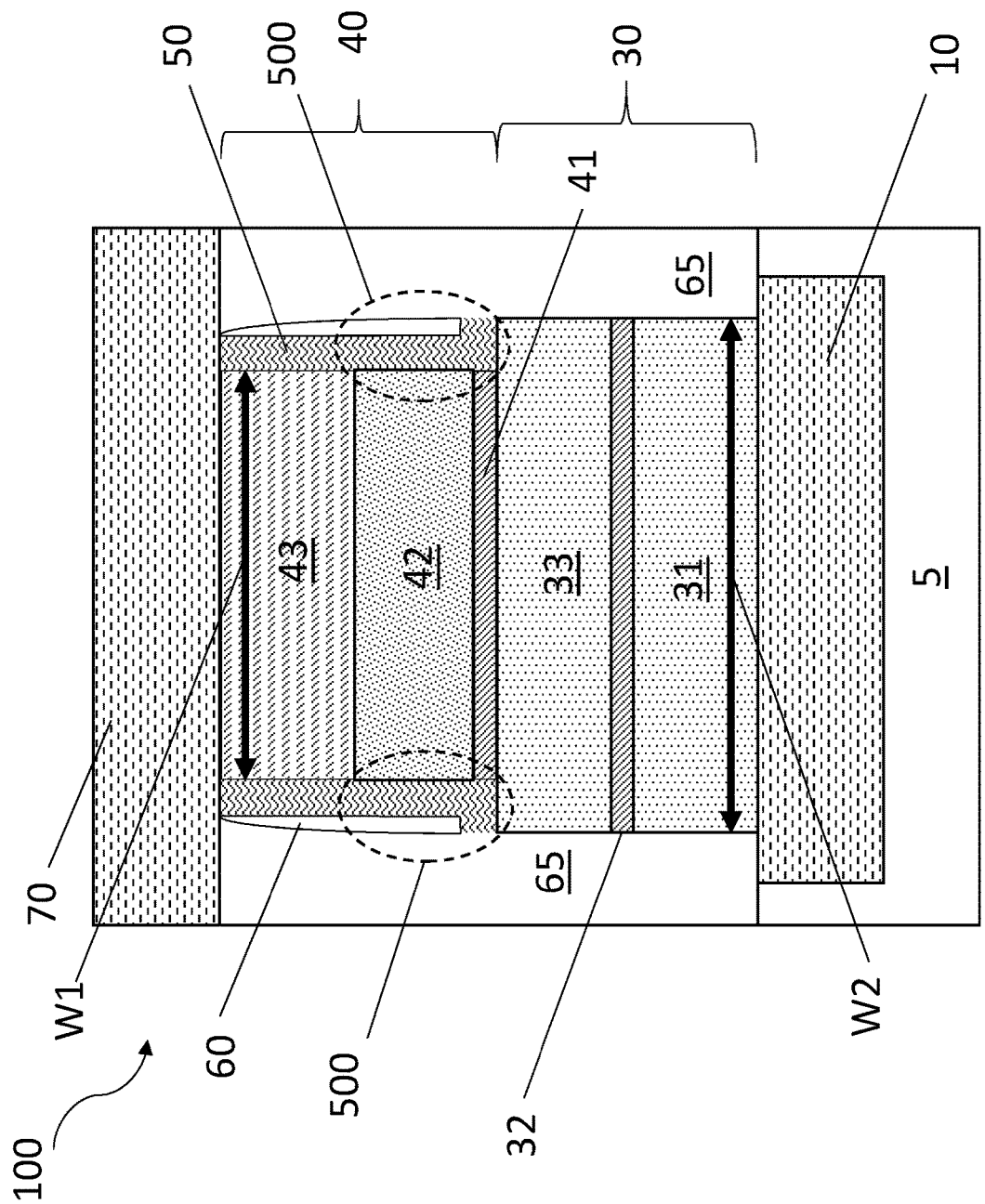
FIG. 1 is a side cross-sectional view of a magnetic tunnel junction (MTJ) with a metallic ring, in which the metallic ring acts as a shunt resistor surrounding a top tunnel barrier of the magnetic tunnel junction (MTJ) structure, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical". "horizontal". "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some instances, the resistance (R) of magnetic tunnel junctions (MTJs) is on the order of 5 kΩ for a ~35 nm width MTJ pillar. A lower resistance can enable lower operating voltage (LP) or faster read speeds (higher drive current faster current sense integration time). In some embodiments, methods and structures are provided herein describing an MTJ stack with a metallic ring acting as a shunt resistor surrounding op tunnel barrier, thereby providing a low-resistance channel for electrons to travel from the top free layer to the top electrode. The presence of the shunt resistor provides a low resistance pathway from the top electrode (also referred to as electrode hardmask) to the free layer of the magnetic tunnel junction (MJT) structure without disturbing the additional perpendicular magnetic anisotropy (PMA) from the top tunnel barrier. The methods and structures described herein address the need to form a metallic tunnel junction with a low series resistance. The methods and structures of the present disclosure are now described with reference to FIGS. 1-7.

FIG. 1 illustrates one embodiment a magnetic tunnel junction (MTJ) structure 30 with a metallic ring 50, in which the metallic ring 50 acts as a shunt resistor surrounding a top tunnel barrier of the magnetic tunnel junction (MTJ) structure 30. In some embodiments, the electrical device structure 100 includes a magnetic tunnel junction structure 30 including a first tunnel junction dielectric layer 32 positioned between a free magnetization layer 33 and a fixed magnetization layer 31.

In some embodiments, the magnetic orientation of the magnetic layers, i.e., the free magnetization layer 33 and the fixed magnetization layer 31, of the magnetic tunnel junction (MTJ)) structure 30 is in a perpendicular direction. The perpendicular direction, for example, refers to the direction which is perpendicular to the surface of a substrate 5 or perpendicular to the plane of the layers of the MTJ structure 30. In one embodiment, a magnetically fixed layer, i.e., fixed magnetization layer 31, is disposed below the magnetic free layer, i.e., free magnetization layer 33, forming a bottom pinned perpendicular MTJ (Mil) element. The perpendicular direction of the fixed layer is in a first perpendicular direction. The first perpendicular direction is shown to be in an upward direction away from the substrate. Providing the first perpendicular direction which is in a downward direction towards the substrate 5 may also be useful. As for the magnetic orientation of the free layer, it may be programmed to be in a first or same (parallel) direction as the fixed layer or in a second or opposite (anti-parallel) direction as the fixed layer.

Each of the fixed magnetization layer 33 and the free magnetization layer 31 may be composed of a ferromagnetic material. For example, each of the fixed magnetization layer 33 and the free magnetization layer 31 may be composed of a composition including cobalt (Co), iron (Fe), nickel (Ni), boron (B), or any combination thereof. In one example, the fixed magnetization layer 33 can be formed of CoFeB or CoFe. In one example, the free magnetization layer 31 can be formed of CoFeB or CoFe. Each of the fixed magnetization layer 33 and the free magnetization layer 31 may have a thickness ranging from 10 nm to 100 nm. In some embodiments, each of the fixed magnetization layer 33 and the free magnetization layer 31 may have a thickness ranging from 20 nm to 50 nm.

In some embodiments, the fixed magnetization layer 33 may include a synthetic antiferromagnet (SAF) consisting of two ferromagnetic layers antiferromagnetically coupled through a nonmagnetic: spacer layer (such as Ru). In some embodiments, the dipolar interaction between the two magnetic electrodes results in a highly asymmetrical reversal of the free layer, i.e., free magnetization layer 31, with respect to the applied field or to the current density. Moreover, if the induced shift of the loop (Hcoupl) is greater than the free layer coercive field (HC), only one resistance state remains stable at zero field, which is not suitable for applications. For in-plane MTJ, this problem can be been solved by replacing the pinned layer with a synthetic antiferromagnet (SAF) consisting of two ferromagnetic layers antiferromagnetically coupled through a nonmagnetic spacer layer (such as Ru). In one embodiment, the synthetic antiferromagnet (SAF) employed for the fixed magnetization layer 33 may include a stack of Ta3/Pt30/(Co0.5/Pt0.4)5/Co0.5/Ru0.85/(Co0.5/Pt0.4)3/Co0.5/CoFeB1.

The first tunnel junction dielectric layer 32 is present between the fixed magnetization layer 33 and the free magnetization layer 31 and is the site of tunnel magnetoresistance (TMR), which is the magnetoresistive effect that occurs in the magnetic tunnel junction (MTJ) structure. The first tunnel barrier layer 32 can be formed of a non-magnetic, insulating material such as magnesium oxide (MgO), aluminum oxide ($Al_2O_3$), or titanium oxide ($TiO_2$) or any other suitable materials. The first tunnel barrier layer 32 may have a thickness ranging from 1 nm to 10 nm. In some embodiments, the first funnel barrier layer 32 may have a thickness ranging from 2 nm to 5 nm.

The magnetic tunnel junction (MTJ) structure 30 is present on a metal line 10 that is formed within a substrate 4, in which the fixed magnetization layer 33 is in electrical contact with the metal line 10. The substrate 5 may comprise a semiconducting material, an insulating material, a conductive material or any combination thereof (e.g., a lower level of an interconnect structure). When the substrate 5 is comprised of a semiconducting material, any semiconductor such as Si, SiGe, SiGeC, SIC, Ge alloys, GaAs, InAs, InP, other III/V or II/VI compound semiconductors, and organic semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

The metal lines 10 may be formed in the substrate 5 using photolithography and etching to form trenches (for the metal lines) followed by filling the trenches with an electrically conductive material, such as a metal or metal containing material, e.g., copper (Cu), aluminum (Al) tungsten (W), tungsten nitride WN), titanium (Ti), titanium nitride (TiN), and combinations thereof.

Referring to FIG. 1, in some embodiments, a magnetization enhancement stack 40 is present on the magnetic tunnel junction (MTJ) structure 30. The magnetization enhancement stack 40 increases efficiency of the underlying magnetic tunnel junction (MJT) structure 30 by increasing the magnetic anisotropy of magnetic tunnel junction (MJT) structure 30. In designs that do not include the metallic ring 50 of the present design, the separation of the free magnetization layer 33 of the magnetic tunnel junction (MJT) structure 30 from the electrically conductive features carrying current to the magnetic tunnel junction structure 30 by the second tunnel junction layer negatively increases the resistance of the magnetic tunnel junction (MJT) structure 30. As will be describe herein, the metallic ring 50 provides an electrical pathway on the sidewalls of a pedestal structure of the magnetization enhancement stack 40 that extends into direct contact with the free magnetization layer 33 of the magnetic tunnel junction (MTJ) structure 30. In this design, the magnetization enhancement stack 40 increases efficiency of the underlying magnetic tunnel junction (MJT) structure 30 by increasing the magnetic anisotropy of magnetic tunnel junction (MJT) structure 30, while the metallic ring structure 50 provides that the magnetic tunnel junction (MJT) structure 30 has a low series resistance.

In some embodiments, the magnetization enhancement stack 40 includes a second tunnel junction layer 41, a metal contact layer 42 present on the second tunnel junction layer 41, and a metal electrode layer 43 present on the metal contact layer 42.

In some examples, the second tunnel junction layer 41 of the magnetization enhancement stack 40 is in contact with the free magnetization layer 33 of the magnetic tunnel junction (MTJ) structure 30. The second tunnel junction layer 41 may have the same composition or be of a different composition as the first tunnel junction layer 21. For example, the second tunnel junction layer 41 can be formed of a non-magnetic, insulating material such as magnesium oxide (MgO), aluminum oxide (Al$_2$O$_3$), or titanium oxide (TiO$_2$) or any other suitable materials. The second tunnel junction layer 41 may have a thickness ranging from 1 nm to 10 nm. In some embodiments, the second tunnel junction layer 41 may have a thickness ranging from 2 nm to 5 nm.

The metal contact layer 42 that is present on the second tunnel junction layer 41 may be composed of any metal and/or metal nitride, such as tantalum, tantalum nitride, ruthenium, titanium, etc. In one example, the metal contact layer 42 is composed of ruthenium (Ru) that is in direct contact with a second tunnel junction layer 41 that is composed of magnesium oxide (MgO). In some embodiments, the metal contact layer 42 may have a thickness ranging from 10 nm to 100 nm. In some embodiments, the metal contact layer 42 may have a thickness ranging from 20 nm to 50 nm.

A metal electrode layer 43 may be present on the metal contact layer 42. The metal electrode layer 43 may also be referred to as a top electrode (TE) or a hard mask layer (HM). In some embodiments, the metal electrode layer 43 protects the underlying metal contact layer and MJT during etching process steps and may function as an etch mask. In some embodiments, the metal electrode layer 43 will act as a CMP stopper after the pillars of the magnetization enhancement stack 40 and the magnetic tunnel junction (MTJ) structure 30 have been overlaid with dielectrics, e.g., interlevel dielectric layers 65. In some embodiments, although TaN may be preferred for the composition of the metal electrode layer 43, other metallic materials may also be suitable for the metal electrode layer 43, such as Ti, TiN, Ta, Ru, W, Cr and combinations thereof.

In one example, the magnetization enhancement stack 40 has a width W1 less than a width W2 of the magnetic tunnel junction (MTJ) structure 30. Because the magnetic enhancement stack 40 has a lesser width than the magnetic tunnel junction (MTJ) structure 30, the magnetic enhancement stack 40 may be described as having a pedestal geometry.

Referring to FIG. 1, a metallic ring 50 is present around the magnetic enhancement stack 40, wherein a base of the metallic ring 50 is in contact with the free magnetization layer 33 of the magnetic tunnel junction (MTJ) structure 30. In some embodiments, the metallic ring 50 functions as a shunt resistor to provide a channel 500, i.e., pathway, for electrical current to be transmitted from the metal electrode layer 43 to the free magnetization layer 33. In some embodiments, the metallic ring 50 provides an electrical pathway 500 on the sidewalls of a pedestal structure of the magnetization enhancement stack 40 that extends into direct contact with the free magnetization layer 33 of the magnetic tunnel junction (mu) structure 30. In this design, the magnetization enhancement stack 40 increases efficiency of the underlying magnetic tunnel junction (NUT) structure 30 by increasing the magnetic anisotropy of magnetic tunnel junction (MJT) structure 30, while the metallic ring structure 50 provides that the magnetic tunnel junction (MJT) structure 30 has a low series resistance.

In some embodiments, the metallic ring 50 is composed of a metal nitride. In some embodiments, the metal nitride that provides the composition of the metallic ring 50 is selected from the group consisting of tantalum nitride (TaN), titanium nitride (TiN), tungsten nitride (WN), zirconium nitride (ZrN), molybdenum nitride and combinations thereof. In other embodiments, an elemental metal may be employed as the composition of the metallic ring 50. In this example, the metallic ring 50 may be composed of copper, aluminum, titanium, tantalum, tungsten, platinum, silver, titanium, silver and combinations thereof.

In some embodiments, the metallic ring 50 has an inner diameter ranging from 30 nm to 40 nm, and an outer diameter ranging from 35 nm to 45 nm. The height of the metallic ring may range from 1 nm to 5 nm. In one example, the inner diameter of the metallic ring 50 may be equal to 35 nm, the outer diameter of the metallic ring 50 may be equal to 38 nm, and the height of the metallic ring 50 may be equal to 3 nm. In some embodiments, the metallic ring 50 has a resistivity ($\sigma$) ranging from 3 k$\Omega$*nm to 6 k$\Omega$*nm.

In some embodiments, the metallic ring 50 may have a ring like geometry, but is not necessary that the metallic ring 50 have an exterior sidewalls that has a circular perimeter. In some examples, the metallic ring 50 may be oblong, and in some examples, the metallic ring 50 can have an exterior perimeter that is multi-sided.

Referring to FIG. 1, a dielectric spacer 60 is present on an outer sidewall of the metallic ring 50. The dielectric spacer 60 may be composed of any dielectric material, such as oxide, nitride or oxynitride materials. In one embodiment, the dielectric spacer 60 is composed of silicon nitride. The outside sidewall of the dielectric spacer 60 is aligned with an outside sidewall of the magnetic tunnel junction (MJT) structure 30.

An interlevel dielectric 65 may encapsulate the side ails of the structure, i.e., magnetic tunnel junction (MTJ) 30, magnetic enhancement stack 40 and dielectric spacers 60. The upper surface of the interlevel dielectric 65 may have an upper surface that is coplanar with the upper surface of the metal electrode layer 43. The interlevel dielectric 65 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

A metal line 70 may be in electrical contact with the metal electrode layer 43. The metal line 70 that is in electrical contact with the metal electrode layer 43 is similar to the metal line 10 that is in electrical contact with the fixed magnetization layer 31. Therefore, the description of the metal line 10 that is in contact with the fixed magnetization layer 31 is suitable for the description of the metal line 70 that is in contact with the metal electrode layer 43.

In one example, the electrical device 100 that is depicted in FIG. 1 includes a magnetic enhancement stack 40 that includes a second tunnel junction layer 41 that is composed of magnesium oxide (MgO), a metal contact layer 42 is composed of ruthenium (Ru), and a metal electrode layer 43 is composed of tantalum nitride (TaN). In this example, the magnetic tunnel junction (MJT) structure 30 is composed of a first tunnel junction dielectric layer 32 that is composed of magnesium oxide (MgO) and each of the free magnetization layer 31 and the fixed magnetization layer 33 are composed of cobalt (Co), iron (Fe) or a combination thereof. The metallic ring 50 is composed of tantalum nitride (TaN). As noted, the metallic ring 50 can function similar to a shunt ring. The shunt ring dimensions in this example include an inner diameter of 35 nm, an outer diameter of 38 nm, and a height of 3 nm. The resistivity (σ) of the metallic ring 50 can range from 3 kΩ*nm to 6 kΩ*nm, in which the resistance ($R_{shunt}$) of the metallic ring 50 may range from ~50 kΩ to ~100Ω.

In one example, the second tunnel junction layer 41 of the magnetic enhancement stack 40 has a resistance of approximately 2.5 kΩ, and the shunt resistor (metallic ring 50) has a resistance of approximately 100Ω, in which the parallel combination is equal to approximately 96Ω. For a conventional 5 kΩ magnetic tunnel junction (MTJ) stack, roughly 50% of the resistance results from the top MgO layer, i.e., the second tunnel junction layer 41. Replacement of the high resistance element, i.e., the top MGO layer, with a 96Ω conductive pathway provided by the metallic ring 50 depicted in FIG. 1 can produce an approximately 48% reduction in the resistance of the magnetic tunnel junction (MTJ) structure 30.

FIGS. 2-7 illustrate one embodiment of a method for forming the electrical device 100 that is depicted in FIG. 1.

Figure 2:
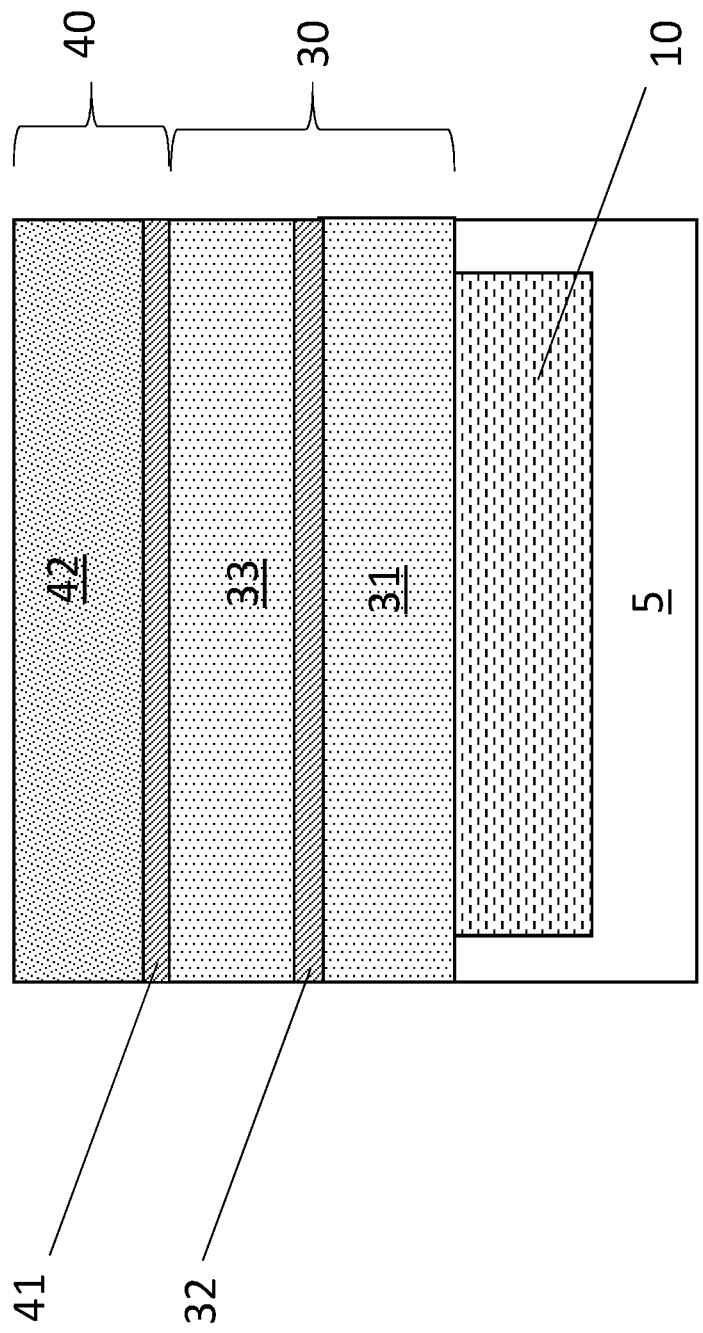
FIG. 2 is a side cross-sectional view of one embodiment of an initial structure including a magnetization enhancement stack that is present on a magnetic tunnel junction (MJT) structure for forming a magnetic tunnel junction with a low resistance.

FIG. 2 depicts one embodiment of an initial structure including a magnetization enhancement stack 40 that is present on a magnetic tunnel junction (MJT) structure 30 for forming a magnetic tunnel junction (MTJ) structure with a low resistance. The metal line 10 may be formed in the substrate 5 by forming a trench in the substrate 5, and then filling the trench with an electrically conductive material, e.g., a metal, using a deposition process, such as physical vapor deposition (PVD), e.g., sputtering, plating, e.g., electroplating, and/or chemical vapor deposition.

Referring to FIG. 2, material layers may be blanket deposited atop the substrate 5 and metal line 10 structure to provide the magnetic tunnel junction (MTJ) structure 30 atop the substrate 5 having the fixed magnetization layer 31 in contact with the metal line 10, and the magnetization enhancement stack 40 atop the magnetic tunnel junction (MTJ) structure 30. Each of the fixed magnetization layer 31, the first tunnel junction dielectric layer 32, the free magnetization layer 33, the second tunnel junction layer 41, and the metal contact layer 42 may be deposited by one of chemical vapor deposition (CND), e.g., plasma enhanced chemical vapor deposition (PECVD) and/or metal organic chemical vapor deposition (MOCVD); atomic layer deposition (ALD); physical vapor deposition (PVD), e.g., sputtering; plating, e.g., electroplating and/or electroless plating; and combinations thereof.

Figure 3:
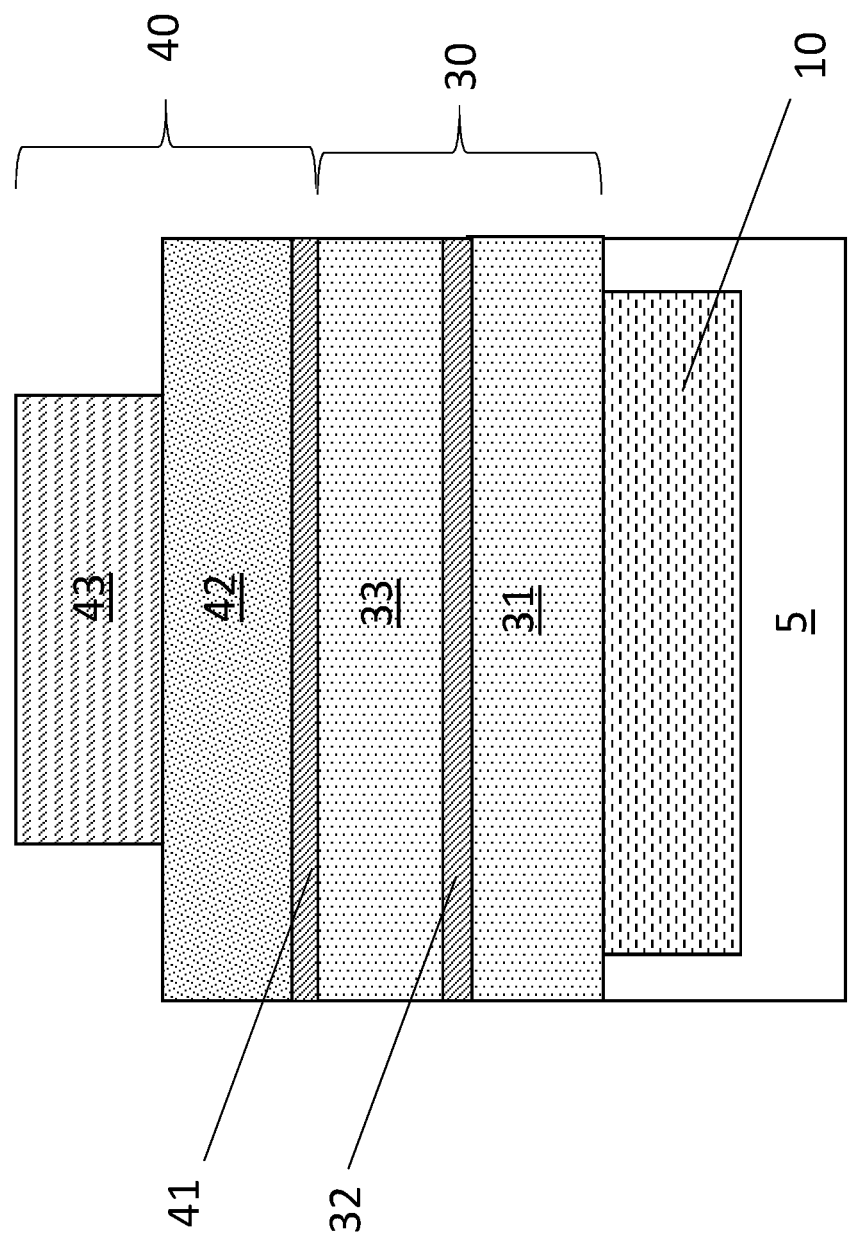
FIG. 3 is a side cross-sectional view of one embodiment of forming an electrode hardmask atop a layered stack including a magnetization enhancement stack that is present on the magnetic tunnel junction (MJT) structure.

FIG. 3 depicts one embodiment of forming an electrode hardmask 43 atop a layered stack including a magnetization enhancement stack 40 that is present on the magnetic tunnel junction (MJT) structure 30. First, a metal containing layer for the electrode hardmask 43 is blanket deposited atop the metal contact layer 42. Deposition processes for forming the blanket material layer for the electrode hardmask 43 can include physical vapor deposition (PVD), e.g., sputtering; plating, e.g., electroplating and/or electroless plating; chemical vapor deposition (CVD); and other type deposition processes. Following deposition of the metal, the blanket deposited material layer may then be patterned to provide the geometry of the electrode hardmask 43.

Patterning at this stage of the process flow may include deposition, photolithograph, development and etching. Specifically, an etch pattern ask is produced by applying a photoresist to the surface to be etched; exposing the photoresist to a pattern of radiation; and then developing the pattern into the photoresist utilizing resist developer. Once the patterning of the photoresist is completed the etch pattern mask is formed, and the sections of the blanket deposited material for the electrode hardmask 43 that are covered by the photoresist, i.e., etch pattern mask, are protected while the exposed regions are removed using a selective etching process that removes the unprotected regions. The etch process may be an anisotropic etch process. As used herein, an "anisotropic etch process" denotes a material removal process in which the etch rate in the direction normal to the surface to be etched is greater than in the direction parallel to the surface to be etched. The etch process for removing the exposed portions of the blanket deposited material for the electrode hardmask 43 that is employed at this stage of the process flow may be provided by reactive ion etch (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

Figure 4:
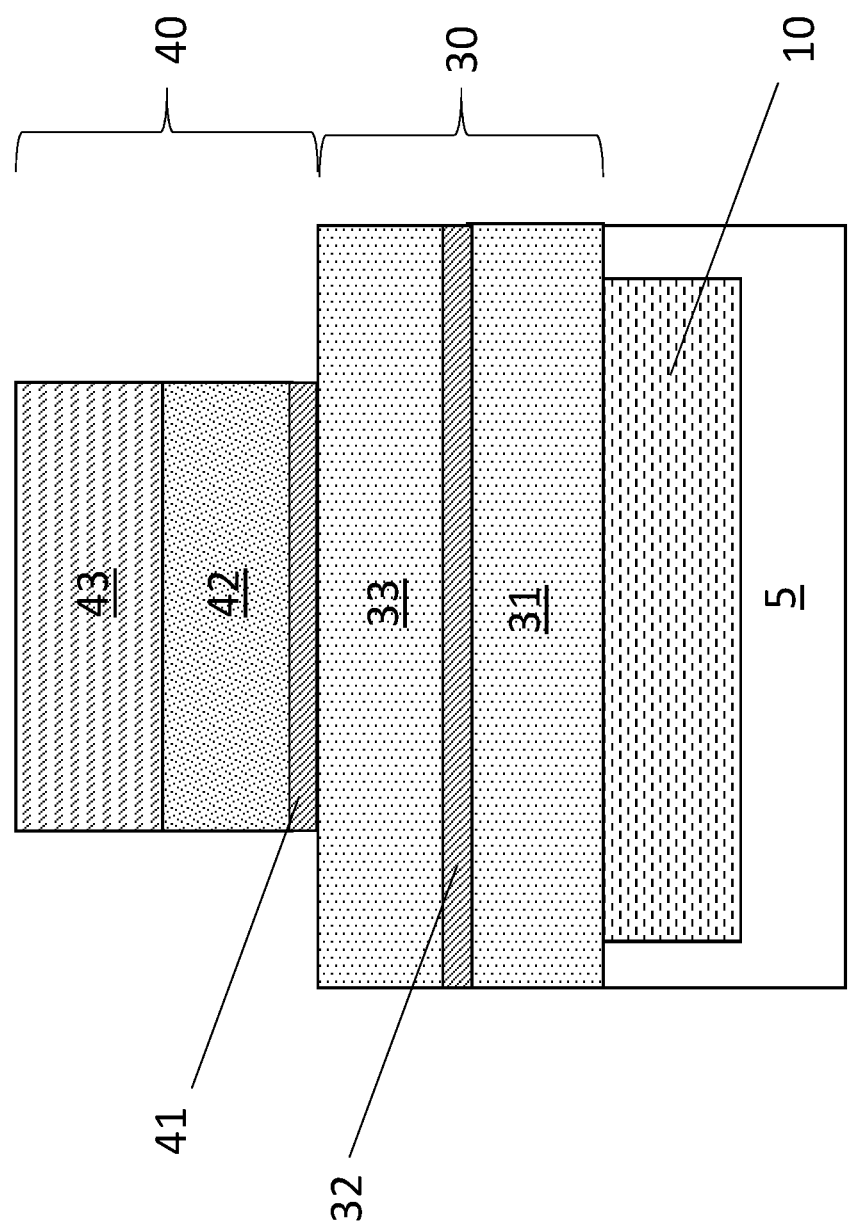
FIG. 4 is a side cross-sectional view of employing the electrode hardmask as an etch mask for etching at least a tunnel junction dielectric layer of the magnetization enhancement stack to provide a pedestal of the magnetization enhancement stack having a width less than the magnetic tunnel junction (MTJ) structure.

FIG. 4 depicts one embodiment of employing the electrode hardmask 43 as an etch mask for etching the metal contact layer 42 and the second tunnel junction dielectric layer 41 of the magnetization enhancement stack 40 to provide a pedestal of the magnetization enhancement stack 40 having a width less than the width of the magnetic tunnel junction (MTJ) structure 30. The etch process employed at this stage of the process flow may be an anisotropic etch process. For example, the etch process for providing the pedestal of the magnetization enhancement stack 40 may include ion beam etching (IBE) using end point detection to terminate the etch process upon detection that the etch process has removed the exposed portions of the second tunnel junction dielectric layer 41 and exposed the free magnetization layer 33 of the magnetic tunnel junction (MTJ) structure 30. In some embodiments, the etch process for removing the exposed portions of the second tunnel junction dielectric layer 41 may be selective to the free magnetization layer 33. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater.

Figure 5:
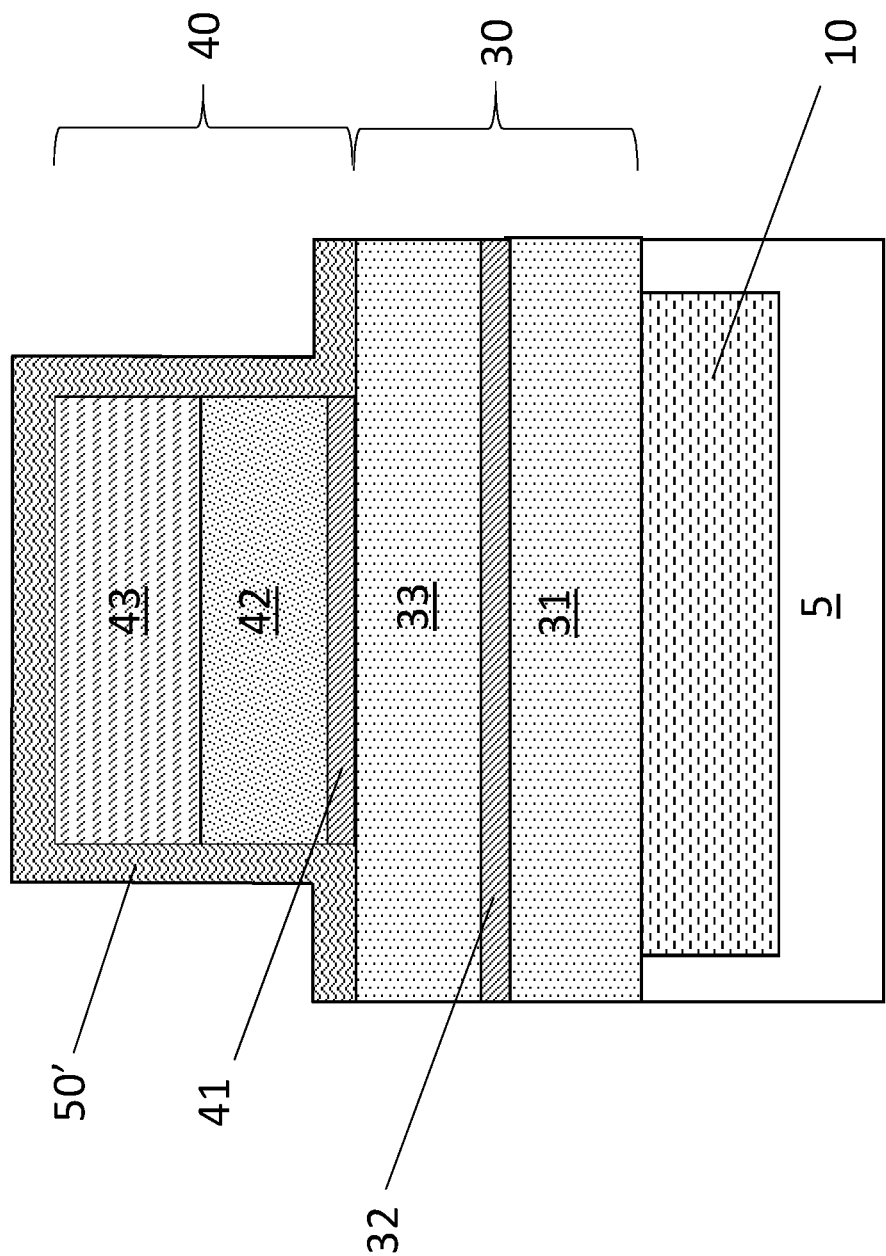
FIG. 5 is a side cross-sectional view depicting one embodiment of forming a metallic ring on a sidewall of the pedestal of the magnetization enhancement stack, wherein a base of the metallic ring may be in contact with a free magnetization layer of the magnetic tunnel junction structure.

FIG. 5 depicts one embodiment of forming a metallic ring 50 on a sidewall of the pedestal of the magnetization enhancement stack 40, wherein a base of the metallic ring 50 may be in contact with a free magnetization layer 33 of the magnetic tunnel junction structure 30. Forming the metallic ring 50 may begin with a conformal deposition of a blanket material layer 50' on the structure depicted in FIG. 4. The term "conformal" denotes a layer having a thickness that does not deviate from greater a less than 30% of an average value for the thickness of the layer. In one embodiment, the conformal deposition for the blanket material layer 50' that provides the metallic ring 50 may be provided by atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

The blanket deposited layer 50' may be present on the exposed supper surfaces of the free magnetic layer 33, and the sidewall and upper surfaces of the pedestal of the magnetization enhancement stack 40. The thickness of the atomic layer deposition (ALD) deposited blanket material layer for the metallic ring 50' may range from 1 nm to 10 nm.

In one embodiment, the thickness of the atomic layer deposition (ALD) deposited blanket material layer for the metallic ring 50' may range from 2 nm to 5 nm. In one example, the thickness of the layer deposition (ALD) deposited blanket material layer for the metallic ring 50' is equal to 3 nm. In one example, the atomic layer deposition (ALD) deposited blanket material layer for the metallic ring 50' may be tantalum nitride (TaN).

Figure 6:
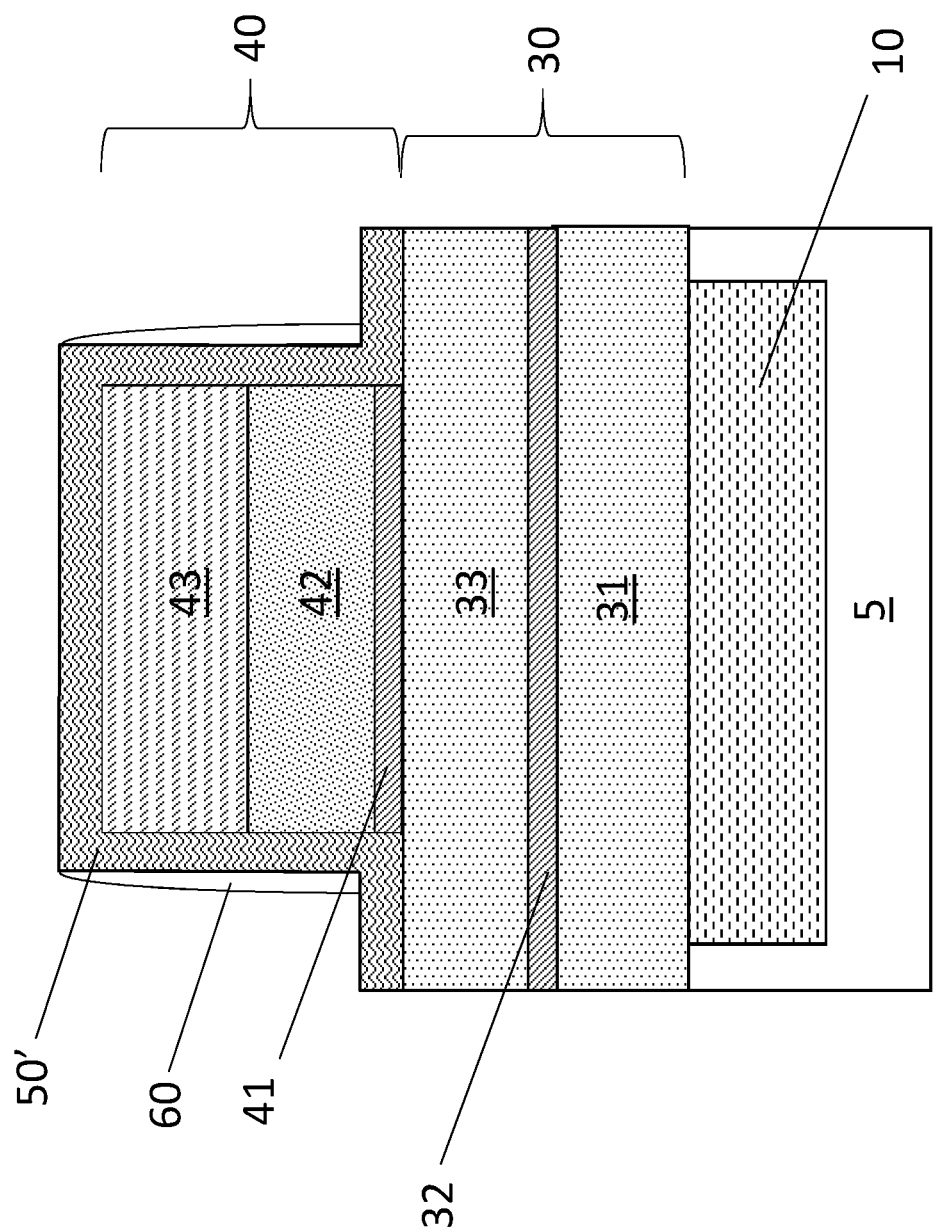
FIG. 6 is a side cross-sectional view depicting one embodiment of forming a sidewall spacer on outside sidewall of the metallic ring.

FIG. 6 depicts one embodiment of forming a sidewall spacer 65 on an outside sidewall the metallic ring 50. The all spacers 65 may be composed of a dielectric material, such as an oxide, nitride or oxynitride material. In some embodiments, the sidewall spacers 65 may be composed of silicon nitride. The sidewall spacers 65 may be formed using a deposition process, such as chemical vapor deposition followed by an etch back process. The etch back process may be an anisotropic etch, such as reactive ion etching, laser etching or ion beam etching.

Figure 7:
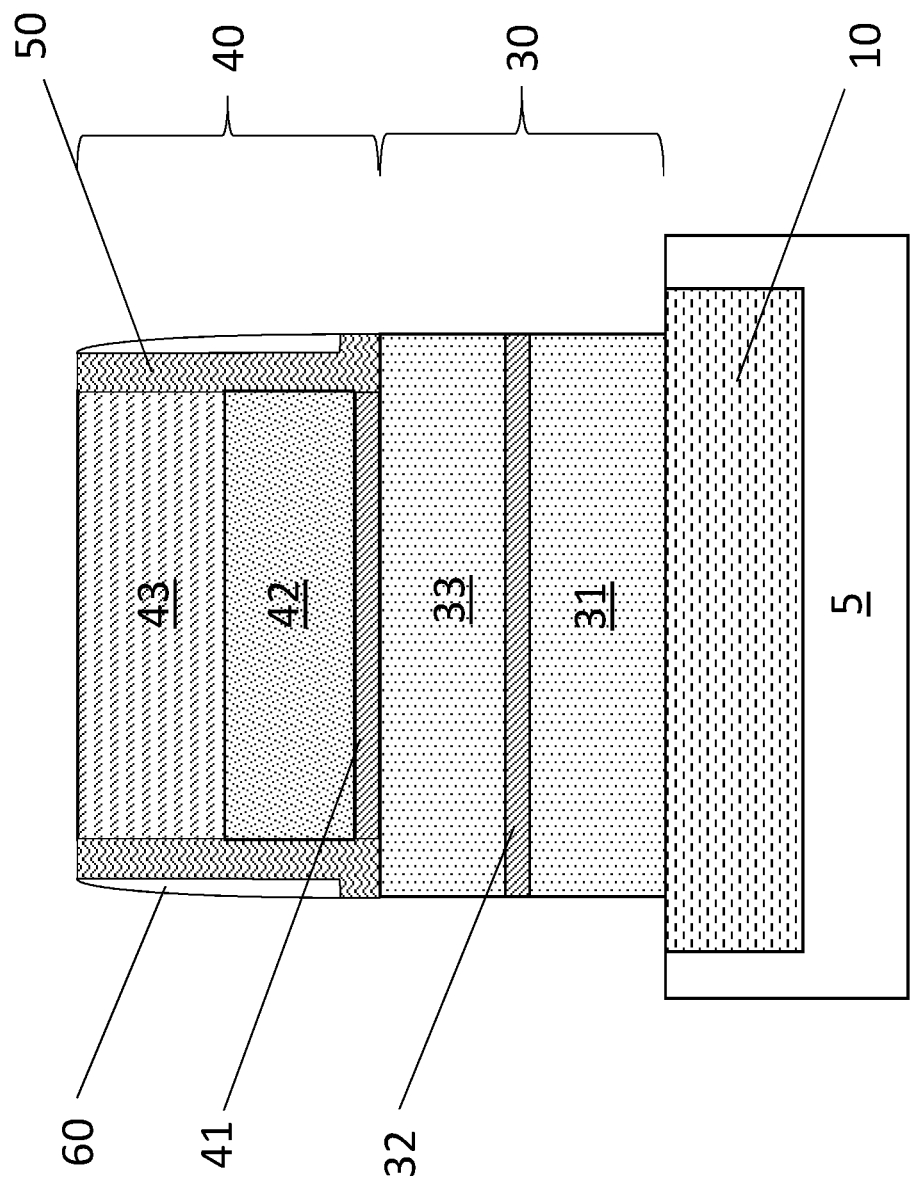
FIG. 7 is a side cross-sectional view of etching exposed portion of the magnetic tunnel junction using the sidewall spacer and the hardmask as an etch mask.

FIG. 7 depicts one embodiment of etching exposed portion of the magnetic tunnel junction structure 30 using the sidewall spacer 65 and the hardmask 43 as an etch mask. The etch process may be an anisotropic etch, such as reactive ion etching, laser etching or ion beam etching. The etch process may be continued until the exposed portions of the blanket material layer for the metallic ring 50', the free magnetization layer 33, the first tunnel junction dielectric layer 32, and the fixed magnetization layer 31 are removed stopping on the substrate 5, as depicted in FIG. 7.

Referring to FIG. 1 the interlevel dielectric layer 65 is then formed atop the structure depicted in FIG. 7 using a deposition process, such as chemical vapor deposition (CVD), spin on deposition, and/or deposition from solution. Following deposition, the interlevel dielectric layer 65 is planarized to have an upper surface coplanar with the upper surface of the metal electrode layer 43. One example of a planarization process suitable for use with this stage of the process flow is chemical mechanical planarization.

The metal line 70 can be formed of any suitable conductive material(s) such as tantalum, tantalum nitride, ruthenium, titanium, etc. The metal layer can be formed by atomic layer deposition (ALD); physical vapor deposition (PVD), e.g., sputtering; plating, e.g., electroplating and/or electroless plating; and combinations thereof.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

when used herein, specify the presence of stated features, integers, steps, operations, elements and/or components, but do not preclude the presence or addition of one or more other features, integers, steps, operations, elements, components and/or groups thereof.

Having described preferred embodiments of a magnetic tunnel junction with lower series resistance, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device structure comprising:
a magnetic tunnel junction structure including a first tunnel junction dielectric layer positioned between a free magnetization layer and a fixed magnetization layer;
a magnetization enhancement stack present on the magnetic tunnel junction structure, wherein the magnetization enhancement stack comprises a second tunnel junction layer that is in contact with the free magnetization layer of the magnetic tunnel junction structure, a metal contact layer present on the second tunnel junction layer, and a metal electrode layer present on the metal contact layer;
a metallic ring on a sidewall of the magnetic enhancement stack, wherein a base of the metallic ring may be in contact with the free magnetization layer of the magnetic tunnel junction structure, the metallic ring having an L-shaped side cross-sectional geometry; and
a dielectric spacer present on an outer sidewall of the metallic ring and a base portion of the metallic ring, the outside sidewall of the dielectric spacer aligned with an outside sidewall of the base portion of the metallic ring having the L-shaped side cross-sectional geometry.

2. The electrical device of claim 1, wherein the metallic ring functions as a shunt resistor to provide a channel for electrical current to be transmitted from the free magnetization layer to the metal electrode layer.

3. The electrical device of claim 1, wherein the metallic ring is composed of a metal nitride.

4. The electrical device of claim 3, wherein the metal nitride is selected from the group consisting of tantalum nitride (TaN), titanium nitride (TiN), tungsten nitride (WN), zirconium nitride (ZrN), molybdenum nitride and combinations thereof.

5. The electrical device of claim 1, wherein the metallic ring has an inner diameter ranging from 30 nm to 40 nm, and an outer diameter ranging from 35 nm to 45 nm.

6. The electrical device of claim 5, wherein the metallic ring has a height ranging from 1 nm to 5 nm.

7. The electrical device of claim 6, wherein the metallic ring has a resistivity (p) ranging from 3 kΩ*nm to 6 kΩ*nm.

8. The electrical device of claim 7, wherein the second tunnel junction layer is composed of magnesium oxide (MgO), the metal contact layer is composed of ruthenium (Ru), and the metal electrode layer is composed of tantalum nitride (TaN), the first tunnel junction dielectric layer is composed of magnesium oxide (MgO) and each of the free magnetization layer and the fixed magnetization layer are composed of cobalt (Co), iron (Fe) or a combination thereof.

9. The electrical device of claim 8, wherein the metallic ring provides a reduction in the resistance of the of the magnetic tunnel junction by approximately 50% when compared to similar structures that do not include the metallic ring.

10. An electrical device structure comprising:
a magnetic tunnel junction structure including a first tunnel junction dielectric layer positioned between a free magnetization layer and a fixed magnetization layer;
a magnetization enhancement stack on the magnetic tunnel junction structure, the magnetization enhancement stack has a width less than a width of the magnetic tunnel junction structure, the magnetization enhancement stack including a second tunnel junction layer that is in contact with the free magnetization layer of the magnetic tunnel junction structure, a metal contact layer present on the second tunnel junction layer, and a metal electrode layer present on the metal contact layer;
a metallic ring around the magnetic enhancement stack, wherein a base of the metallic ring is in contact with the free magnetization layer of the magnetic tunnel junction structure; and
a dielectric spacer present on an outer sidewall of the metallic ring, the outside sidewall of the dielectric spacer aligned with an outside sidewall of the magnetic tunnel junction structure.

11. The electrical device of claim 10, wherein the metallic ring functions as a shunt resistor to provide a channel for electrical current to be transmitted from the free magnetization layer to the metal electrode layer.

12. The electrical device of claim 10, wherein the metallic ring is composed of a metal nitride.

13. The electrical device of claim 12, wherein the metal nitride is selected from the group consisting of tantalum nitride (TaN), titanium nitride (TiN), tungsten nitride (WN), zirconium nitride (ZrN), molybdenum nitride and combinations thereof.

14. The electrical device of claim 10, wherein the metallic ring has an inner diameter ranging from 30 nm to 40 nm, and an outer diameter ranging from 35 nm to 45 nm.

15. The electrical device of claim 10, wherein the metallic ring has a height ranging from 1 nm to 5 nm.

16. The electrical device of claim 15, wherein the metallic ring has a resistivity (p) ranging from 3 kΩ*nm to 6 kΩ*nm.

17. The electrical device of claim 16, wherein the second tunnel junction layer is composed of magnesium oxide (MgO), the metal contact layer is composed of ruthenium (Ru), and the metal electrode layer is composed of tantalum nitride (TaN), the first tunnel junction dielectric layer is composed of magnesium oxide (MgO) and each of the free magnetization layer and the fixed magnetization layer are composed of cobalt (Co), iron (Fe) or a combination thereof.

18. The electrical device of claim 17, wherein the metallic ring provides a reduction in the resistance of the of the magnetic tunnel junction by approximately 50% when compared to similar structures that do not include the metallic ring.

* * * * *